(12) United States Patent
Sato

(10) Patent No.: US 11,372,327 B2
(45) Date of Patent: Jun. 28, 2022

(54) MOLDING APPARATUS AND METHOD OF MANUFACTURING ARTICLE

(71) Applicant: CANON KABUSHIKI KAISHA, Tokyo (JP)

(72) Inventor: Takahiro Sato, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 251 days.

(21) Appl. No.: 16/374,821

(22) Filed: Apr. 4, 2019

(65) Prior Publication Data

US 2019/0317397 A1 Oct. 17, 2019

(30) Foreign Application Priority Data

Apr. 11, 2018 (JP) .............................. JP2018-076246

(51) Int. Cl.
 *G03F 7/00* (2006.01)
(52) U.S. Cl.
 CPC ................................... *G03F 7/0002* (2013.01)
(58) Field of Classification Search
 CPC .................................................... G03F 7/0002
 See application file for complete search history.

(56) References Cited

U.S. PATENT DOCUMENTS

| 8,394,282 B2 | 3/2013 | Panga et al. |
| 9,415,418 B2 | 8/2016 | Sreenivasan et al. |
| 2010/0059904 A1 | 3/2010 | Kasumi |
| 2011/0260361 A1* | 10/2011 | Im .................... G03F 7/0002 264/293 |
| 2017/0157810 A1 | 6/2017 | Kondo |

FOREIGN PATENT DOCUMENTS

| JP | 2009518207 A | | 5/2009 |
| JP | 2012004463 A | * | 1/2012 |
| JP | 2012004463 A | | 1/2012 |
| JP | 2017103399 A | | 6/2017 |
| JP | 2017139268 A | | 8/2017 |
| WO | 2007067469 A2 | | 6/2007 |

OTHER PUBLICATIONS

Wang, Qing, Real-time full-area monitoring of the filling process in molds for UV nanoimprint lithography using dark field illumination, Nov. 26, 2012, Journal of Vacuum Science and technology (Year: 2012).*

Office Action issued in Taiwanese Appln. No. 108110232 dated Sep. 10, 2019. English translation provided.

* cited by examiner

*Primary Examiner* — Michael M. Robinson
*Assistant Examiner* — Victoria Bartlett
(74) *Attorney, Agent, or Firm* — Rossi, Kimms & McDowell LLP

(57) ABSTRACT

The present invention provides a molding apparatus that performs a molding process for molding a composition on a substrate using a mold, including a holding unit configured to hold the substrate, and a control unit configured to control the molding process, wherein the control unit starts a process for pressing the mold against the composition on the substrate while the substrate is held by the holding unit with a first holding force, causes the holding unit to hold the substrate with a second holding force smaller than the first holding force after the process is started, and maintains the holding of the substrate by the holding unit with the second holding force until completion of filling of the composition on the substrate into the mold.

18 Claims, 10 Drawing Sheets

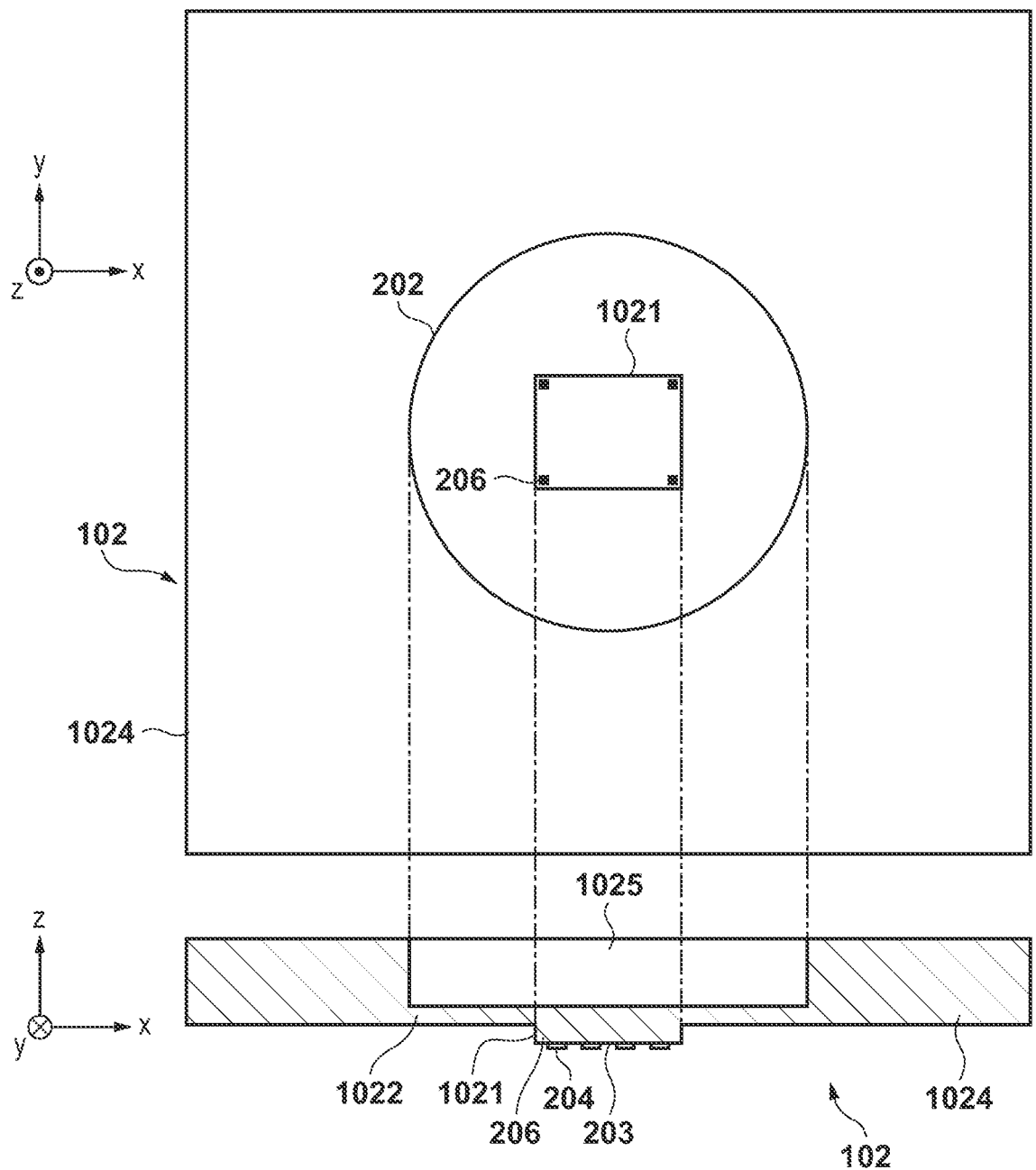

FIG. 6A
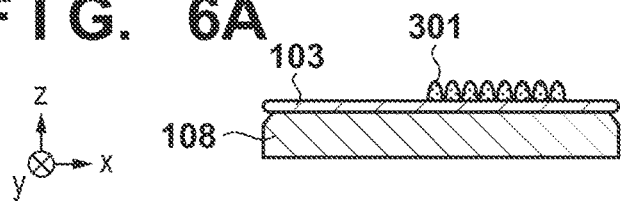 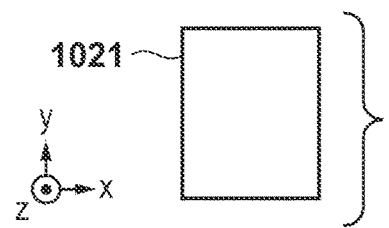
FIG. 6B
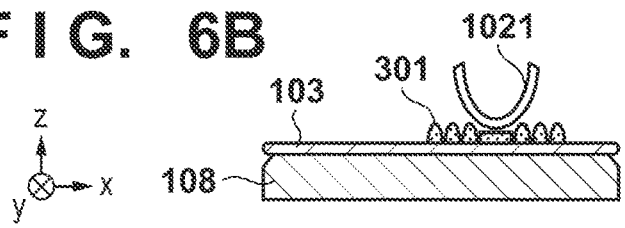 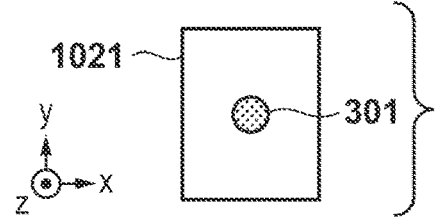
FIG. 6C
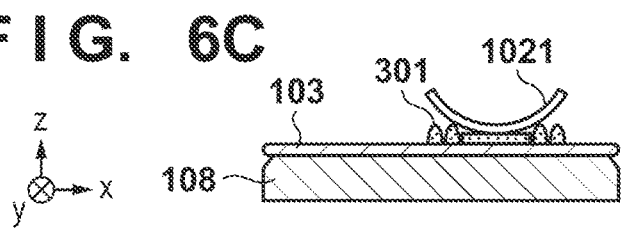 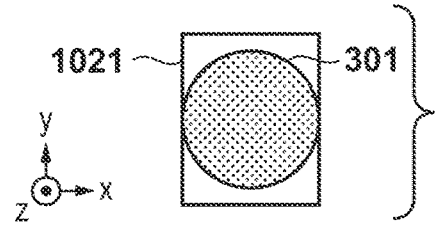
FIG. 6D
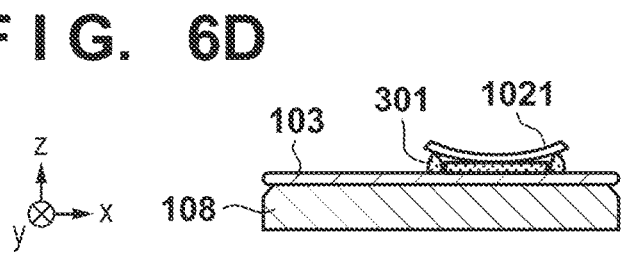 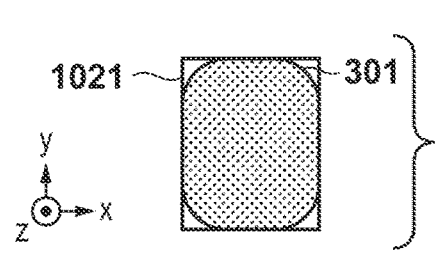
FIG. 6E
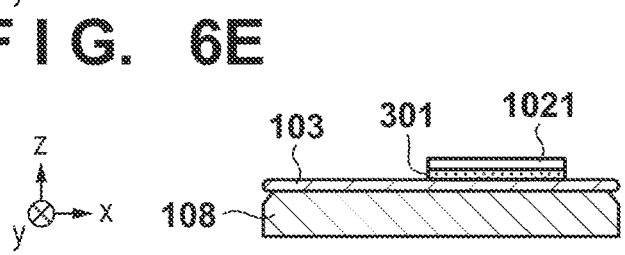 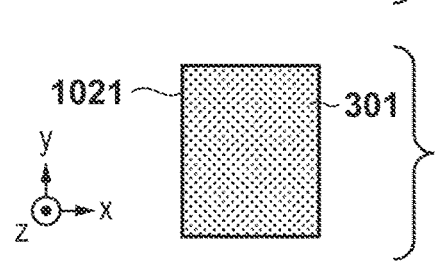
FIG. 6F
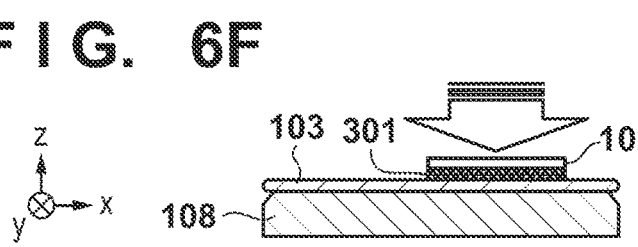 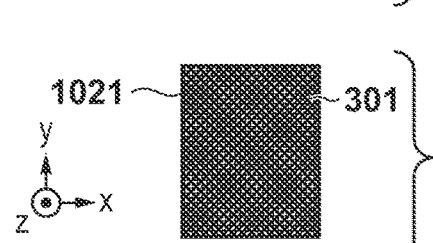
FIG. 6G
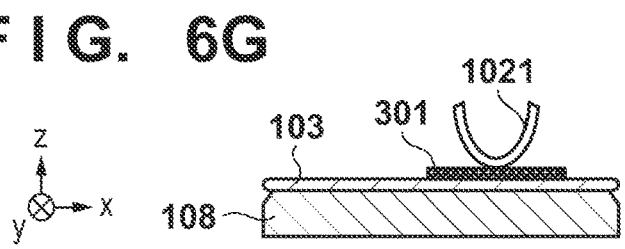 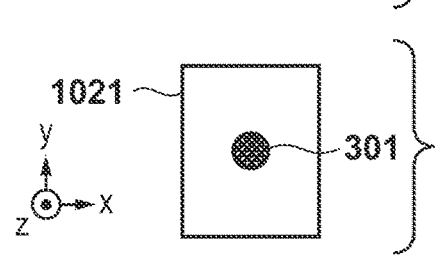

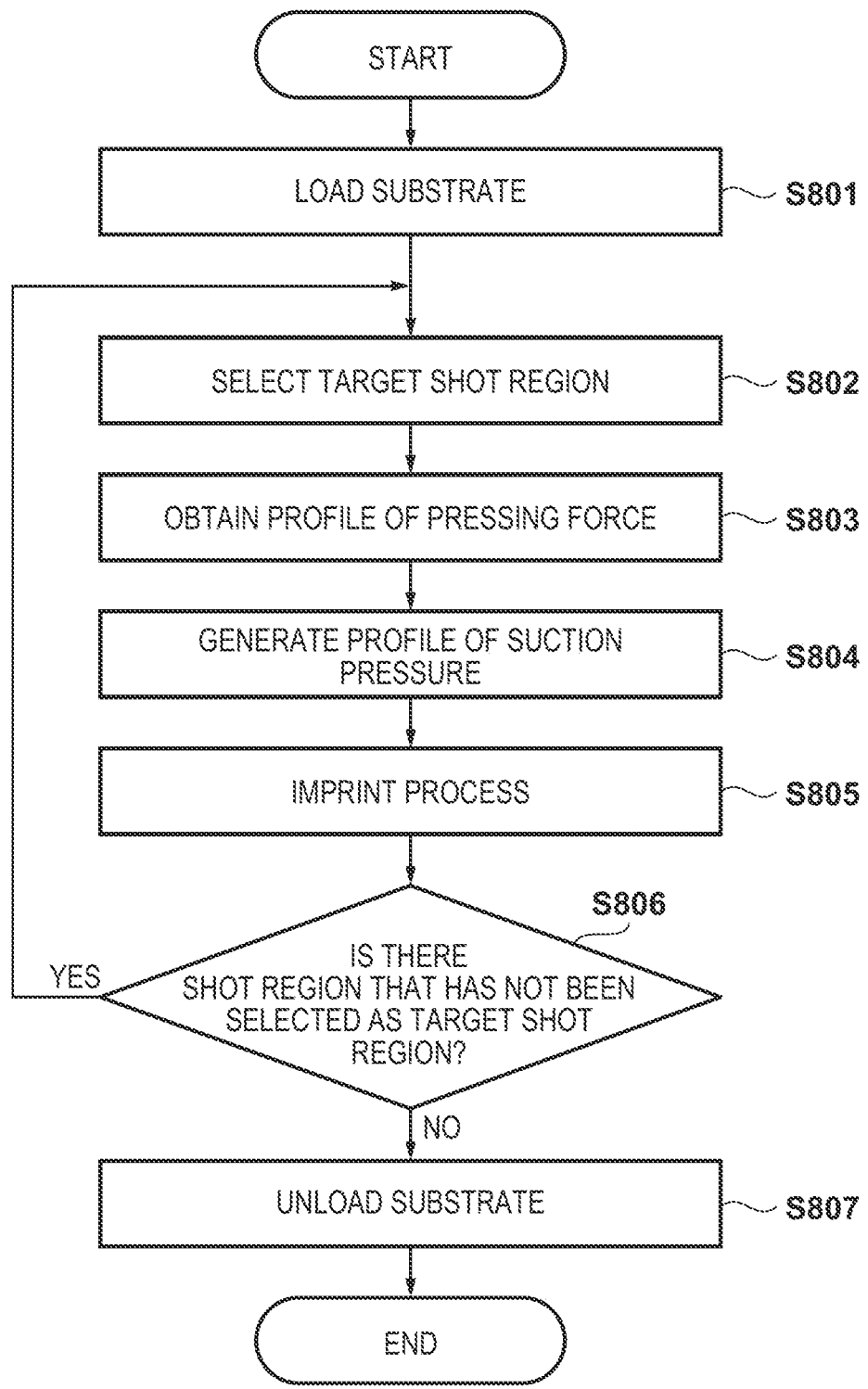

FIG. 11A
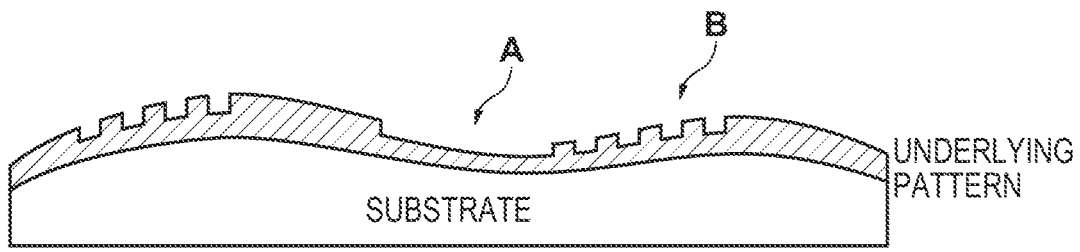
FIG. 11B
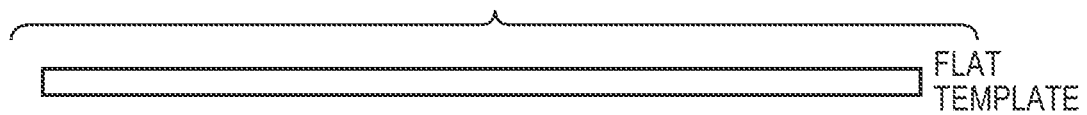
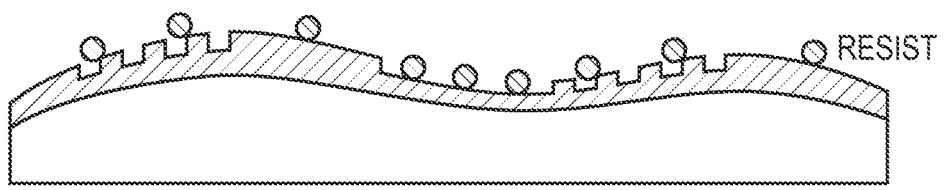
FIG. 11C
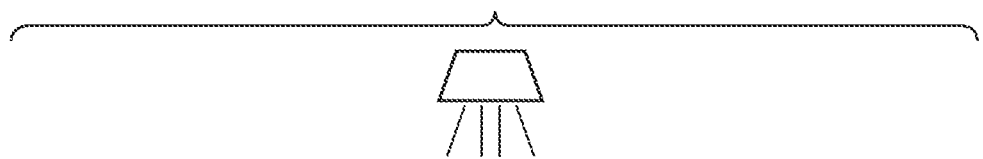
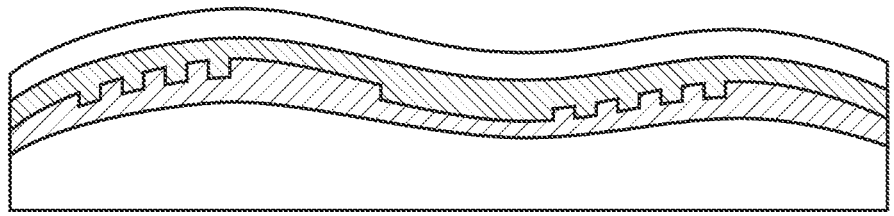
FIG. 11D
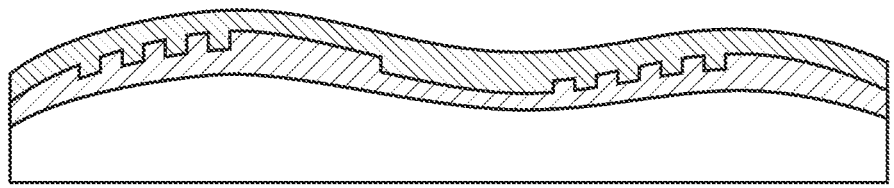

MOLDING APPARATUS AND METHOD OF MANUFACTURING ARTICLE

BACKGROUND OF THE INVENTION

Field of the Invention

The present invention relates to a molding apparatus and a method of manufacturing an article.

Description of the Related Art

As disclosed in Japanese Patent Laid-Open No. 2009-518207 and Japanese Patent Laid-Open No. 2017-103399, an imprint apparatus cures an imprint material in a state in which a mold on which a pattern has been formed and the imprint material on a substrate are in contact with each other, and releases the mold from the cured imprint material, thereby forming the pattern on the substrate. Japanese Patent Laid-Open No. 2009-518207 discloses a technique of deforming a mold into a convex shape toward a substrate upon bringing the mold into contact with an imprint material on a substrate. Japanese Patent Laid-Open No. 2017-103399 discloses a technique of controlling the surface shape of a substrate by controlling the pressure (pressure distribution) applied to the back surface of the substrate upon bringing the mold into contact with the imprint material on the substrate.

In the imprint apparatus, flatness of several μm or less and low roughness accuracy are required on a substrate holding surface for holding (supporting) a substrate in order to maintain the equilibrium between the substrate and the mold. When the flatness of the substrate holding surface is low, a space is generated between the substrate and the substrate holding surface so the pressing force from the mold to the imprint material is not sufficiently transmitted in that region. Accordingly, defects (voids) are generated in the pattern formed on the substrate, resulting in a reduction in yield. On the other hand, when the space between the substrate and the substrate holding surface is set to a high vacuum state so that there is no space, the roughness of the substrate holding surface is transferred to the pattern formed on the substrate, resulting in a reduction in yield.

SUMMARY OF THE INVENTION

The present invention provides a molding apparatus advantageous in improving the yield.

According to one aspect of the present invention, there is provided a molding apparatus that performs a molding process for molding a composition on a substrate using a mold, including a holding unit configured to hold the substrate, and a control unit configured to control the molding process, wherein the control unit starts a process for pressing the mold against the composition on the substrate while the substrate is held by the holding unit with a first holding force, causes the holding unit to hold the substrate with a second holding force smaller than the first holding force after the process is started, and maintains the holding of the substrate by the holding unit with the second holding force until completion of filling of the composition on the substrate into the mold.

Further aspects of the present invention will become apparent from the following description of exemplary embodiments with reference to the attached drawings.

BRIEF DESCRIPTION OF THE DRAWINGS

FIG. 4 is a view schematically showing the arrangement of a mold.

FIGS. 6A to 6G are views for explaining an imprint process for a mold entire surface shot region.

FIG. 9 is a flowchart for explaining the operation of the imprint apparatus shown in FIG. 1.

FIGS. 11A to 11D are views for explaining a case in which the imprint apparatus shown in FIG. 1 is used as a planarizing apparatus.

DESCRIPTION OF THE EMBODIMENTS

Figure 1:
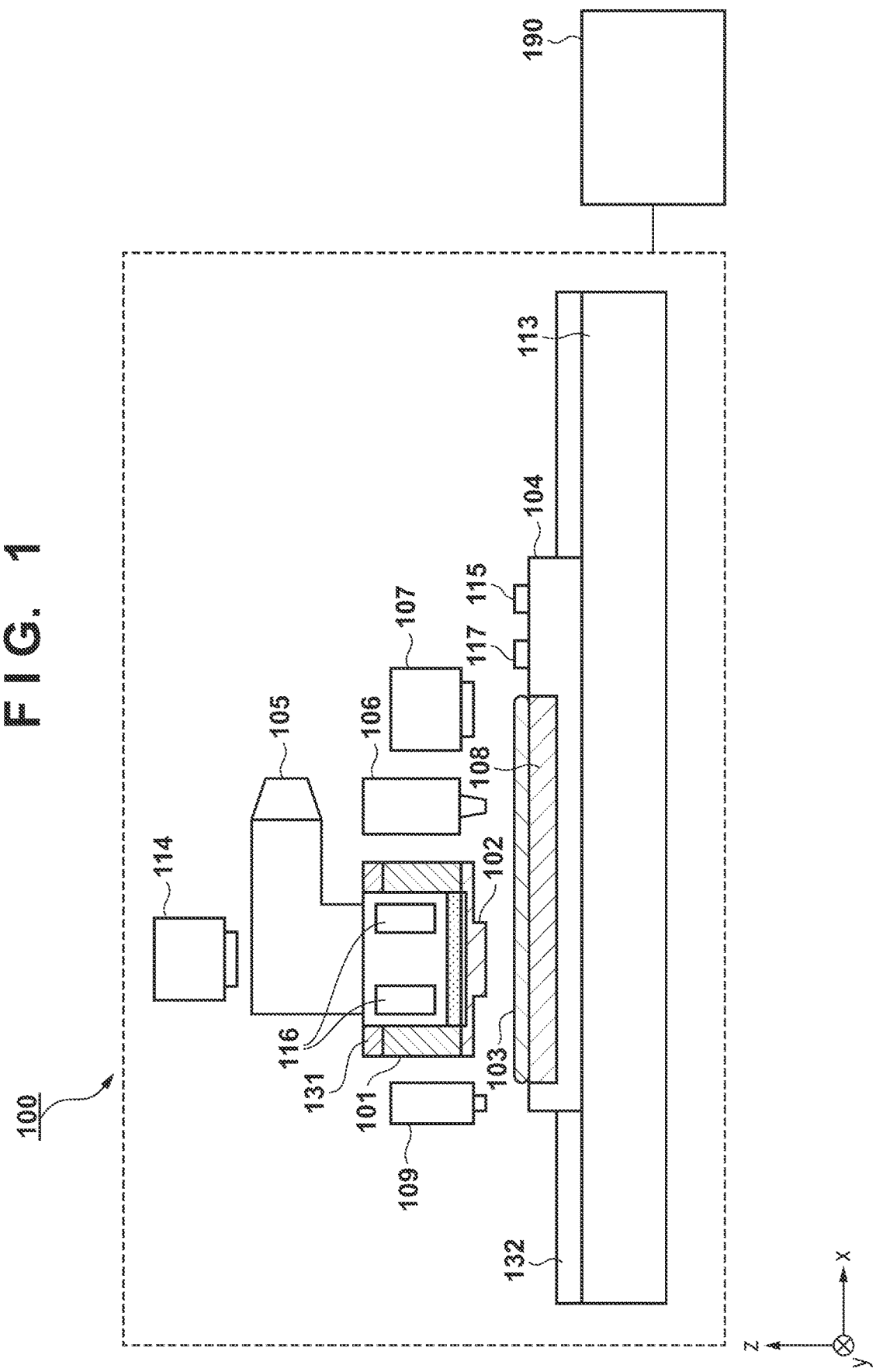
FIG. 1 is a view schematically showing the arrangement of an imprint apparatus as one aspect of the present invention.

Preferred embodiments of the present invention will be described below with reference to the accompanying drawings. Note that the same reference numerals denote the same members throughout the drawings, and a repetitive description thereof will not be given.

FIG. 1 is a view schematically showing the arrangement of an imprint apparatus 100 as one aspect of the present invention. The imprint apparatus 100 is a lithography apparatus that is employed in a lithography process, which is a manufacturing process of a semiconductor device or a liquid crystal display element, and forms a pattern on a substrate. The imprint apparatus 100 functions as a molding apparatus that performs a molding process for molding a composition on a substrate using a mold (template or member). In this embodiment, the imprint apparatus 100 brings an imprint material supplied onto the substrate into contact with a mold and applies curing energy to the imprint material, whereby forming a pattern of the cured product to which the uneven pattern of the mold is transferred.

As an imprint material, a curable composition (to be also referred to as an uncured material and a resin in an uncured state) to be cured by receiving the curing energy is used. Examples of the curing energy are an electromagnetic wave, heat, and the like. As the electromagnetic wave, for example, light which is selected from the wavelength range of 10 nm (inclusive) to 1 mm (inclusive) and includes infrared light, a visible light beam, and ultraviolet light is used.

The curable composition is a composition cured with light irradiation or heating. The photo-curable composition cured by light irradiation contains at least a polymerizable compound and a photopolymerization initiator, and may contain a non-polymerizable compound or a solvent, as needed. The non-polymerizable compound is at least one material selected from the group consisting of a sensitizer, a hydrogen donor, an internal mold release agent, a surfactant, an antioxidant, and a polymer component.

The imprint material may be applied in a film shape onto the substrate by a spin coater or a slit coater. The imprint material may also be applied, onto the substrate, in the form of droplets or in the form of an island or film obtained by connecting a plurality of droplets using a liquid injection head. The viscosity (the viscosity at 25° C.) of the imprint material is, for example, 1 mPa·s (inclusive) to 100 mPa·s (inclusive).

As the substrate, glass, a ceramic, a metal, a semiconductor, a resin, or the like is used. A member made of a material different from the substrate may be formed on the surface of the substrate, as needed. More specifically, the substrate includes a silicon wafer, a compound semiconductor wafer, silica glass, and the like.

As shown in FIG. 1, the imprint apparatus 100 includes a substrate stage 104, a support base 113 for supporting the substrate stage 104, and a substrate driving unit 132 for driving the substrate stage 104 (a substrate 103). The substrate stage 104 is provided with a substrate chuck (holding portion) 108 for holding the substrate 103 by suction and a reference mark 115. The imprint apparatus 100 further includes a mold holding unit 101 for holding a mold 102 and a mold driving unit 131 for driving the mold holding unit 101 (the mold 102).

In this embodiment, directions are shown using the XYZ coordinate system in which the directions parallel to the surface of the substrate 103 are assumed to be on the X-Y plane. The directions parallel to the X-axis, the Y-axis, and the Z-axis in the XYZ coordinate system are assumed to be the X direction, the Y direction, and the Z direction, respectively, and the rotations about the X-axis, the Y-axis, and the Z-axis are denoted by θX, θY, and θZ, respectively. Control or driving (movement) with respect to the X-axis, the Y-axis, and the Z-axis means control or driving with respect to a direction parallel to the X-axis, a direction parallel to the Y-axis, and a direction parallel to the Z-axis, respectively. Control or driving with respect to θX, θY, and θZ means control or driving with respect to a rotation about an axis parallel to the X-axis, a rotation about an axis parallel to the Y-axis, and a rotation about an axis parallel to the Z-axis, respectively.

The substrate driving unit 132 and the mold driving unit 131 form a relative driving mechanism for adjusting the relative position and rotation between the substrate 103 and the mold 102 with respect to six axes of the X-axis, the Y-axis, the Z-axis, the θX-axis, the θY-axis, and the θZ-axis. Adjustment of the relative position between the substrate 103 and the mold 102 with respect to the Z-axis includes an operation of bringing the imprint material on the substrate into contact with the mold 102 (pressing the mold 102 against the imprint material on the substrate) and an operation of releasing the mold 102 from the cured imprint material on the substrate. The substrate driving unit 132 drives the substrate stage 104 so as to, for example, drive the substrate 103 with respect to a plurality of axes (for example, the X-axis, the Y-axis, and the θZ-axis). The mold driving unit 131 drives the mold holding unit 101 so as to drive the mold 102 with respect to a plurality of axes (for example, the X-axis, the Y-axis, the Z-axis, the θX-axis, the θY-axis, and the θZ-axis).

The imprint apparatus 100 further includes an alignment scope 116, a substrate measurement unit 109, an off-axis alignment scope 107, a curing unit 105, an observation unit 114, a supply unit (dispenser) 106, and a mold measurement unit 117.

The alignment scope 116 measures the relative position between the mold 102 and the substrate 103. The alignment scope 116 obtains information indicating the relative position between the mark on the mold 102 and the mark on the substrate 103, for example, an image of the mark on the mold 102 and the mark on the substrate 103 or an image of moire formed by the mark on the mold 102 and the mark on the substrate 103. For example, by providing four alignment scopes 116, marks at the four corners of the shot region of the substrate 103 can be simultaneously detected.

The substrate measurement unit 109 measures the shape of the surface of the substrate 103. In this embodiment, the substrate measurement unit 109 includes a sensor capable of measuring the distance, and measures the height at a plurality of positions on the surface of the substrate 103. The off-axis alignment scope 107 detects the mark on the substrate 103. The curing unit 105 supplies the energy (for example, light) for curing an imprint material to the imprint material on the substrate and cures the imprint material.

The observation unit 114 observes the state of contact between the imprint material on the substrate and the mold 102 and the filling state of the imprint material into the pattern of the mold 102. In this manner, the observation unit 114 functions as an obtaining unit for obtaining the filling state of the imprint material on the substrate into the mold 102.

The supply unit 106 supplies (applies) an imprint material onto a substrate. The supply unit 106 includes, for example, a discharge unit in which a plurality of discharge ports for discharging an imprint material are arrayed. The supply unit 106 may include a driving mechanism that drives the discharge unit with respect to a plurality of axes (for example, six axes).

The mold measurement unit 117 measures the shape of the pattern surface (surface) of the mold 102. In this embodiment, the mold measurement unit 117 includes a sensor capable of measuring the distance, and measures the height at a plurality of positions on the pattern surface of the mold 102.

Figure 2:
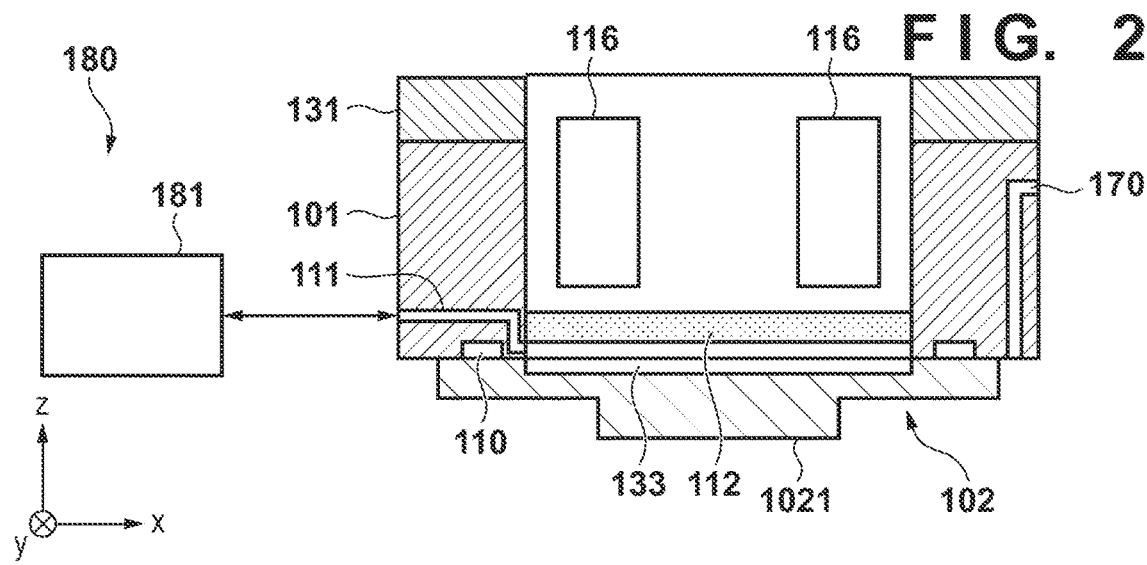
FIG. 2 is a cross-sectional view schematically showing the arrangement of a mold holding unit and the periphery of the mold holding unit.

As shown in FIG. 2, the imprint apparatus 100 further includes a gas supply unit 170 that supplies a purge gas to the space between the mold 102 and the substrate 103. The gas supply unit 170 includes, for example, a channel provided in the mold holding unit 101. As the purge gas, a gas that does not hinder curing of an imprint material on a substrate, for example, a gas including at least one of a helium gas, a nitrogen gas, and a condensable gas (for example, pentafluoropropane (PFP)) is used.

The imprint apparatus 100 further includes a control unit 190 that controls the overall imprint apparatus 100. The control unit 190 is formed by, for example, a computer including a CPU, a memory, and the like, and comprehensively controls the respective units of the imprint apparatus 100 according to a program stored in the storage unit.

FIG. 2 is a sectional view schematically showing the arrangement of the mold holding unit 101 and the periphery of the mold holding unit 101. The mold holding unit 101 includes, for example, a suction portion 110 and holds the mold 102 by sucking the mold 102 using the suction portion 110. The mold 102 includes a mesa-shaped pattern portion (mesa portion) 1021. A pattern to be formed on a substrate is formed on (the pattern surface of) the pattern portion 1021.

The mold holding unit 101 has a structure that, for example, transmits energy for curing an imprint material on a substrate, which is supplied from the curing unit 105, and more specifically, it has a hollow structure. The mold holding unit 101 includes a seal member (for example, sheet glass) 112 for forming a pressure chamber (cavity) 133 on the side of the back surface (the surface opposite to the pattern surface) of the mold 102, a channel 111 for controlling the pressure in the pressure chamber 133, and a pressure control unit 181.

The pressure control unit 181 is connected to the pressure chamber 133 via the channel 111. The pressure control unit 181 controls the pressure in the pressure chamber 133, for example, such that the pressure in the pressure chamber 133 becomes higher than the pressure in the external space. Accordingly, the mold 102 can be deformed such that the pattern portion 1021 (central portion) of the mold 102 has a convex shape toward the substrate 103 (lower side). The pressure control unit 181 and the channel 111 form a mold deformation mechanism 180 that controls (adjusts) deformation of the mold 102.

Figure 3:
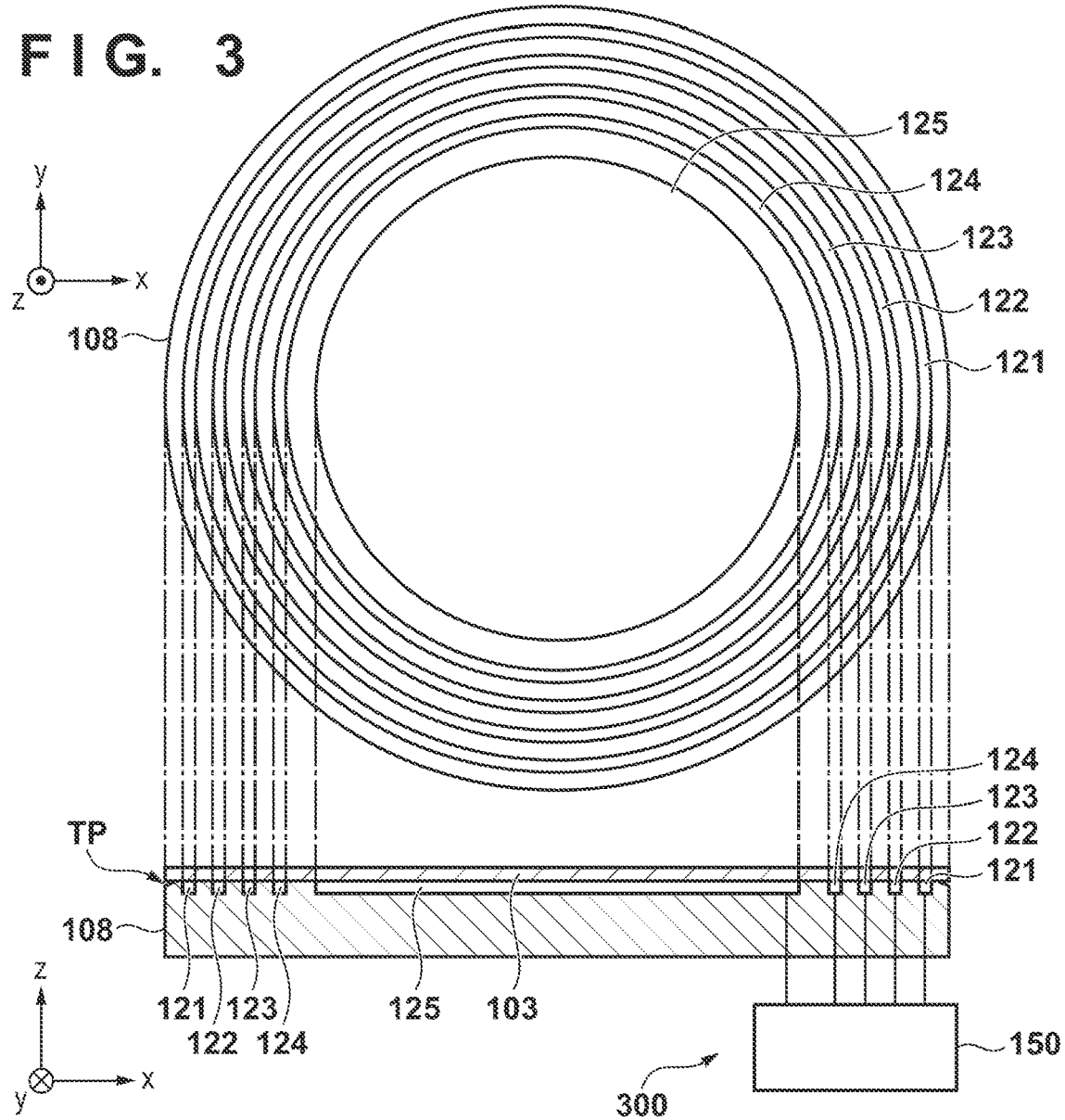
FIG. 3 is a view schematically showing the arrangement of a substrate chuck.

FIG. 3 is a view schematically showing the arrangement of the substrate chuck 108. The substrate chuck 108 includes a pressure control mechanism 300 that controls (adjusts) the suction pressure (the holding force with which the substrate chuck 108 holds the substrate 103) with respect to the substrate 103 under the control of the control unit 190. The pressure control mechanism 300 controls the pressure distribution on the back surface side of the substrate 103.

The pressure control mechanism 300 includes a plurality of concave portions 121, 122, 123, 124, and 125 provided on the surface of the substrate chuck 108, and a pressure control unit 150 capable of individually controlling the pressures in the plurality of concave portions 121 to 125. The plurality of concave portions 121 to 125 form a plurality of holding regions capable of independently controlling the holding force with respect to the substrate 103. For example, consider a case in which the pressure control unit 150 supplies a negative pressure of −40 kPa to the concave portions 122, 123 and 124 and supplies a negative pressure of −5 kPa to the concave portion 121. In this case, it is possible to hold the substrate 103 without bringing the region (part) corresponding to the concave portion 121 of the substrate 103 into tight contact with the substrate chuck 108. Note that the number of the concave portions 121 to 125 is not limited to five, and can be changed to an arbitrary number according to the required specifications. The range and value of the pressure that the pressure control unit 150 can individually supply to the concave portions 121 to 125 are determined according to the required specifications. As shown in FIG. 3, the shape of the concave portions 121 to 125 may be a circular shape or a ring shape arranged concentrically, or may be other shapes. The substrate chuck 108 may include a tapered portion TP at the edge in a plane opposing the substrate 103. Regarding the pressure on the back surface side of the substrate 103, that is, the pressure in the space surrounded by the substrate chuck 108 and the substrate 103, a sensor for measuring the pressure in the space may be provided and control the pressure by the measurement value obtained by the sensor.

FIG. 4 is a view schematically showing the arrangement of the mold 102. The mold 102 includes a thin plate-like movable portion (diaphragm) 1022, the pattern portion 1021 provided so as to protrude from the movable portion 1022, and a support portion 1024 for supporting the movable portion 1022. A hollow portion 1025 surrounded by the support portion 1024 is provided on the back surface side (the side opposite to the side on which the pattern portion 1021 is arranged) of the movable portion 1022. The hollow portion 1025 forms a part of the pressure chamber 133.

The movable portion 1022 has a thickness of, for example, about 1 mm. The pattern portion 1021 has a thickness of, for example, about 30 μm. On the surface (pattern surface) of the pattern portion 1021, a pattern formed by a convex pattern 204 and a concave pattern 203 is formed. The step between the surface of the convex pattern 204 and the surface of the concave pattern 203, that is, the height of the convex pattern 204 is, for example, in the range of several ten nm to several hundred nm. In the pattern portion 1021, one or a plurality of marks 206 are provided.

Figure 5A:
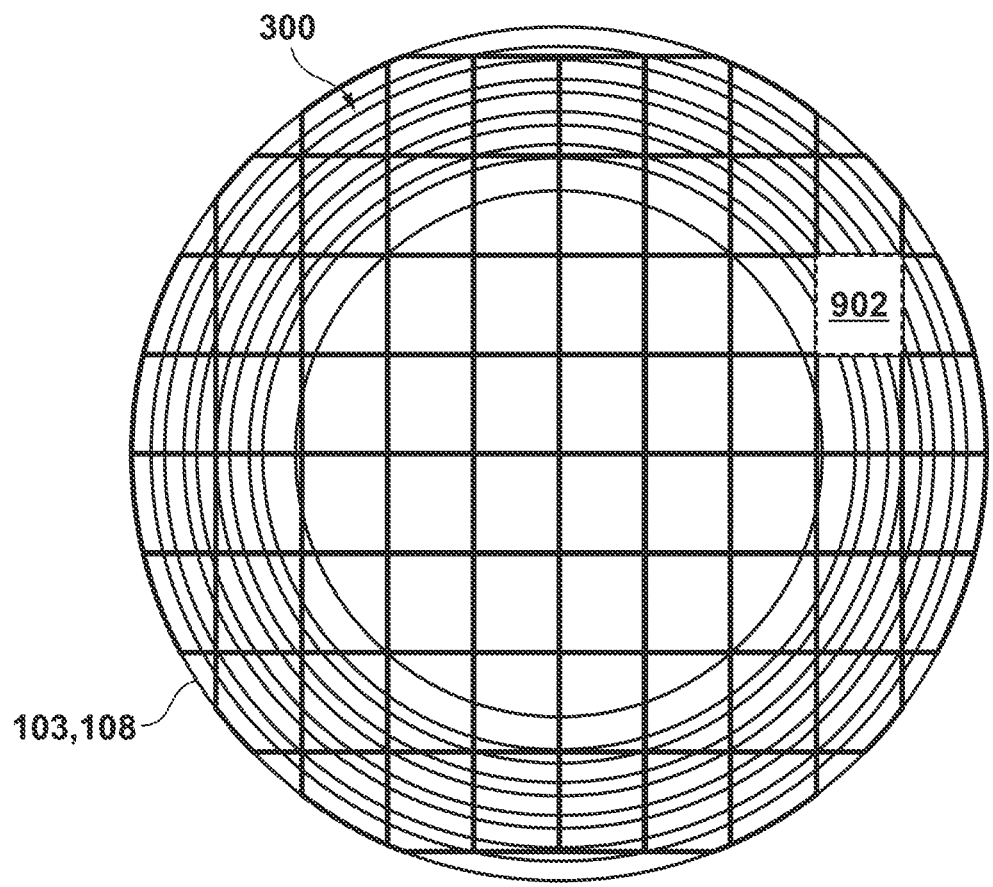
FIGS. 5A and 5B are views showing the positional relationship between the concave portion of the substrate chuck and the pattern portion of the mold.
Figure 5B:
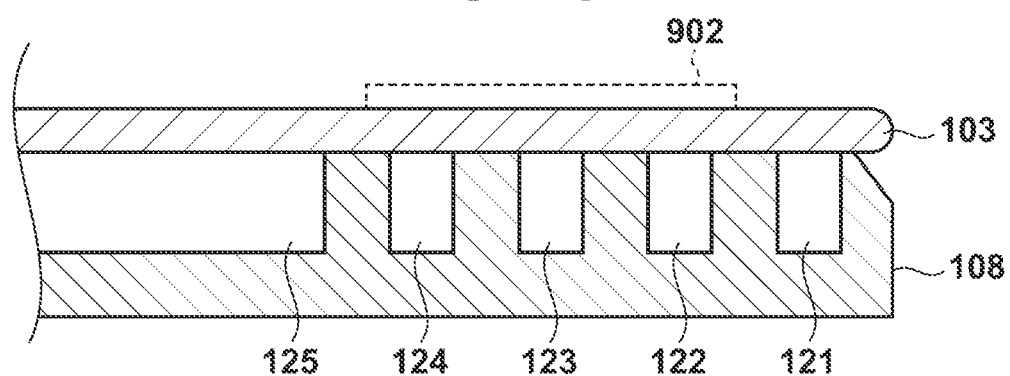

FIGS. 5A and 5B are views showing the positional relationship between the concave portions 121 to 125 of the substrate chuck 108 shown in FIG. 3 and the pattern portion 1021 of the mold 102 upon performing an imprint process for forming a pattern on an imprint material on a substrate using the mold 102 shown in FIG. 4. Referring to FIGS. 5A and 5B, a shot region 902 of the substrate 103 corresponds to a target region for performing the imprint process. Since the entire surface of the pattern portion 1021 of the mold 102 fits in the shot region 902, such a shot region is referred to as a mold entire surface shot region. In this case, the concave portions 122, 123, and 124 are each set as a region directly under the shot (first holding region), and the concave portions 121 and 125 are each set as a shot periphery region (second holding region).

With reference to FIGS. 6A, 6B, 6C, 6D, 6E, 6F, 6G, 7A, and 7B, an imprint process for the mold entire surface shot region in the imprint apparatus 100 will be described. The imprint process is performed by the control unit 190 comprehensively controlling the respective units of the imprint apparatus 100.

Figure 7A:
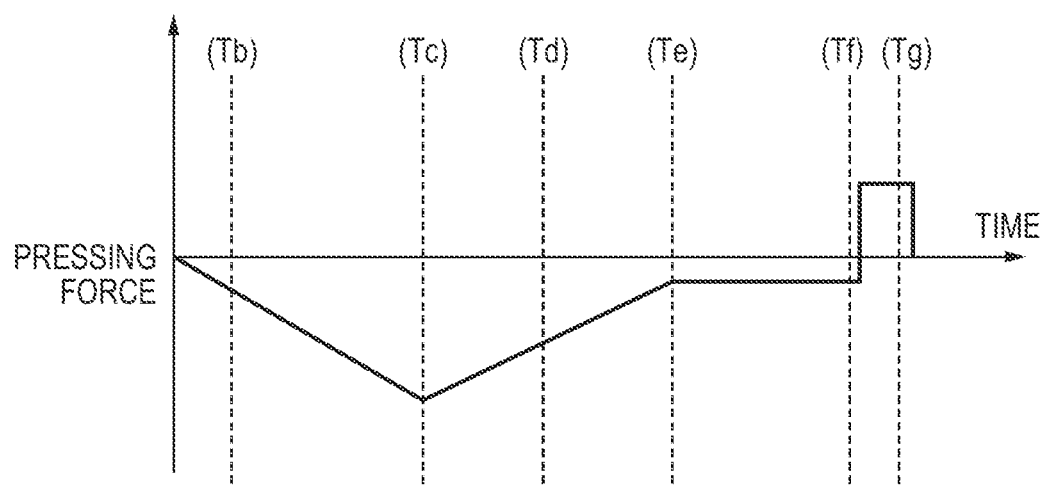
FIGS. 7A and 7B are views for explaining the imprint process for the mold entire surface shot region.
Figure 7B:
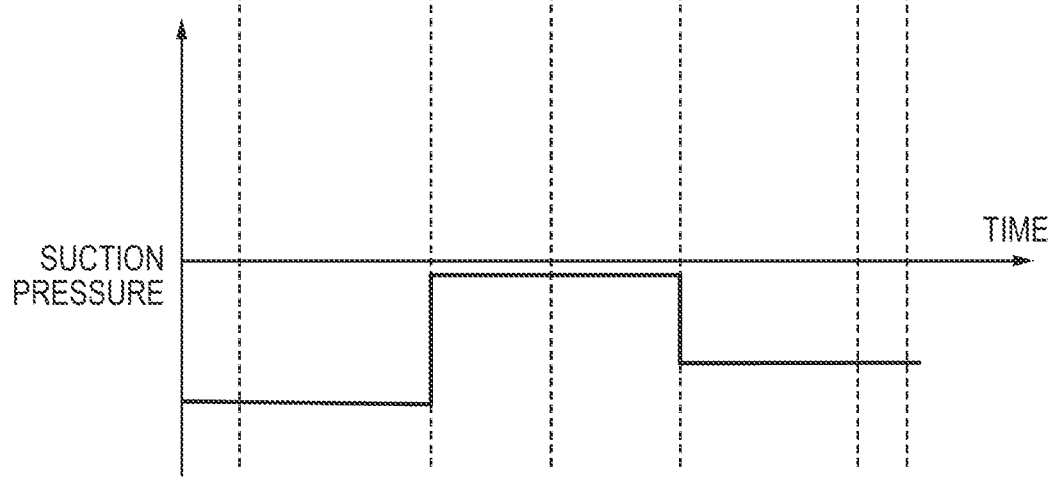

FIGS. 6A to 6G show states of the substrate 103 and the mold 102 during the imprint process. For the sake of simplicity, only the pattern portion 1021 of the mold 102 is shown in FIGS. 6A to 6G. FIG. 7A shows the profile of the pressing force applied to an imprint material 301 on the substrate via the mold 102. The force pressing the imprint material 301 by the mold 102 is taken as the negative pressing force. In FIG. 7A, the ordinate represents the pressing force, and the abscissa represents time. FIG. 7B shows the profile of the suction pressure of the substrate chuck 108 with respect to the substrate 103, and the pressure at which the substrate 103 is sucked by the substrate chuck 108 is taken as the negative suction pressure. In FIG. 7B, the ordinate represents the suction pressure, and the abscissa represents time. Note that the suction pressure shown in FIG. 7B represents the suction pressure in the region directly under the shot of the substrate chuck 108 with respect to the substrate 103, and the explanation concerning the suction pressure is for the region immediately under the shot of the substrate chuck 108, hereinafter. Further, the timings (times) Tb, Tc, Td, Te, Tf and Tg shown in FIGS. 7A and 7B correspond to the states shown in FIGS. 6B, 6C, 6D, 6E, 6F and 6G, respectively.

First, as shown in FIG. 6A, in a state in which a purge gas is supplied from the gas supply unit 170 to the space between the mold 102 and the substrate 103, the control unit 190 controls the mold driving unit 131 to start descending of the mold 102. This makes the mold 102 approach the imprint material 301 supplied from the supply unit 106 to the shot region of the substrate 103. At this time, the control unit 190 controls the pressure control mechanism 300 such that the substrate chuck 108 holds the substrate 103 at a first suction pressure (first holding force). In this manner, the control unit 190 starts a process (pressing process) of pressing the mold 102 against the imprint material 301 on the substrate while the substrate 103 is held by the substrate chuck 108 at the first suction pressure.

Note that before the mold 102 descends, that is, before the pressing process is started, or in parallel with the pressing process, the control unit 190 may control the pressure in the pressure chamber 133 via the pressure control unit 181 such that the mold 102 has a convex shape toward the substrate 103. Generally, it takes about several hundred msec to deform the mold 102 into a target convex shape via the pressure control unit 181. Therefore, in parallel with supply of the imprint material 301 onto the substrate 103 by the supply unit 106, control of the pressure in the pressure chamber 133 by the pressure control unit 181 may be started.

Then, as shown in FIG. 6B, the control unit 190 brings (presses) a part of the pattern portion 1021 of the mold 102 into contact with (against) the imprint material 301 on the substrate. At this time, it is preferable to bring the pattern portion 1021 of the mold 102 into contact with the imprint material 301 on the substrate starting from the central portion of the pattern portion 102 so as to prevent a gas from entering between the substrate 103 and the pattern portion 1021 of the mold 102. The operation of bringing the mold 102 and the substrate 103 close to each other includes, for example, a first operation and a second operation after the first operation. In the first operation, the mold 102 and the substrate 103 are brought close to each other at a first speed. In the second operation, the mold 102 and the substrate 103 are brought close to each other at a second speed slower than the first speed, thereby bringing the mold 102 and the imprint material 301 on the substrate into contact with each other. This can prevent collision between (the pattern portion 1021 of) the mold 102 and the substrate 103. In the state shown in FIG. 6B, the pressing force applied to the imprint material 301 on the substrate via the mold 102 and the suction pressure of the substrate chuck 108 with respect to the substrate 103 correspond to those at the timing Tb shown in FIGS. 7A and 7B, respectively.

Next, as shown in FIG. 6C, the control unit 190 controls the mold driving unit 131 such that the imprint material 301 on the substrate spreads to the end portion of the pattern portion 1021 of the mold 102. As shown in FIG. 7A, this period is a period until the timing Tc at which the pressing force applied to the imprint material 301 on the substrate via the mold 102 is the maximum, that is, a first period in which the pressing force is increased. As shown in FIG. 7B, the suction pressure of the substrate chuck 108 with respect to the substrate 103 maintains the first suction pressure until the timing Tc. In this embodiment, the first suction pressure is the minimum suction pressure in the period between the bringing of the mold 102 into contact with the imprint material 301 on the substrate and the releasing of the mold 102 from the imprint material 301. In this state, since it is an object to bring the substrate chuck 108 and the substrate 103 into tight contact with each other so as not to release the force of the mold driving unit 131, it is preferable that the substrate chuck 108 has a lower suction pressure with respect to the substrate 103.

Then, as shown in FIG. 6D, the control unit 190 controls the mold driving unit 131 such that the imprint material 301 on the substrate spreads over the entire surface of the pattern portion 1021 of the mold 102. As shown in FIG. 7A, this period is a period from the timing Tc to the timing Td during a second period (the period from the timing Tc to the timing Te) in which the pressing force applied to the imprint material 301 on the substrate via the mold 102 is decreased. As shown in FIG. 7B, the suction pressure of the substrate chuck 108 with respect to the substrate 103 is set to a second suction pressure lower than the first suction pressure (switched to a second holding force smaller than the first holding force) at the timing (timing Tc) of transition from the first period to the second period. In this embodiment, the second suction pressure (second holding force) is the maximum suction pressure in the period between the bringing of the mold 102 into contact with the imprint material 301 on the substrate and the releasing of the mold 102 from the imprint material 301. In this manner, by loosening the tight contact between the substrate chuck 108 and the substrate 103, the roughness of the substrate chuck 108 is suppressed from being transferred to the imprint material 301 on the substrate. In order to release the tight contact between the substrate chuck 108 and the substrate 103, the second suction pressure may be set to zero.

Next, as shown in FIG. 6E, the control unit 190 controls the mold driving unit 131 so as to maintain the state in which the imprint material 301 on the substrate spreads over the entire surface of the pattern portion 1021 of the mold 102. Accordingly, the imprint material 301 on the substrate is filled in the pattern portion 1021 (concave pattern 203) of the mold 102. As shown in FIG. 7A, this period is a period from the timing Td to the timing Te during the second period in which the pressing force applied to the imprint material 301 on the substrate via the mold 102 is decreased. As shown in FIG. 7B, the suction pressure of the substrate chuck 108 with respect to the substrate 103 maintains the second suction pressure until the timing Te. Then, at the timing (timing Te) at which the second period ends, a third suction pressure higher than the second suction pressure is set (switching to a third holding force larger than the second holding force is performed). Note that in this embodiment, the third suction pressure (third holding force) is a suction pressure lower than the first suction pressure (smaller than the first holding force), but it may be equal to the first suction pressure.

Next, as shown in FIG. 6F, the control unit 190 controls the curing unit 105 such that energy for curing the imprint material 301 on the substrate is supplied to the imprint material 301 on the substrate. Accordingly, the imprint material 301 on the substrate is cured, and the pattern formed in the pattern portion 1021 of the mold 102 is transferred to the imprint material 301. In the state shown in FIG. 6F, the pressing force applied to the imprint material 301 on the substrate via the mold 102 and the suction pressure of the substrate chuck 108 with respect to the substrate 103 correspond to those at the timing Tf shown in FIGS. 7A and 7B, respectively.

Next, as shown in FIG. 6G, the control unit 190 controls the mold driving unit 131 such that the mold 102 is released from the cured imprint material 301 on the substrate. In the state shown in FIG. 6G, the pressing force applied to the imprint material 301 on the substrate via the mold 102 and the suction pressure of the substrate chuck 108 with respect to the substrate 103 correspond to those at the timing Tg shown in FIGS. 7A and 7B, respectively.

As described above, in this embodiment, after the pressing process is started, for example, in a period during which a pressing force is applied to the imprint material 301 on the substrate via the mold 102, the suction pressure of the substrate chuck 108 with respect to the substrate 103 is switched from the first suction pressure to the second suction pressure. The state in which the substrate chuck 108 holds the substrate 103 at the second suction pressure is maintained until the filling of the imprint material 301 on the substrate into the mold 102 is completed. Accordingly, the pressing force from the mold 102 to the imprint material 301 is sufficiently transferred, and the roughness of the substrate chuck 108 is suppressed from being transferred to a pattern formed on the substrate, so that it is possible to improve the yield.

In addition, in this embodiment, after the filling of the imprint material 301 on the substrate into the mold 102 is completed and before the imprint material 301 is cured, the suction pressure of the substrate chuck 108 with respect to the substrate 103 is switched from the second suction pressure to the third suction pressure. This makes it possible to maintain the transfer accuracy of the pattern formed on the substrate, as well as to prevent the occurrence of dechucking upon releasing the mold 102 from the cured imprint material 301 on the substrate. Note that the timing of switching the suction pressure of the substrate chuck 108 with respect to the substrate 103 from the second suction pressure to the third suction pressure may be set after the imprint material 301 is cured and before the mold 102 is released from the imprint material 301.

Regarding the shot periphery region other than the region directly under the shot of the substrate chuck 108, it is not necessary to switch the suction pressure with respect to the substrate 103. Regarding the shot periphery region of the substrate chuck 108, it is sufficient to maintain the state in which the substrate 103 is held at the first suction pressure during a period from the start of the pressing process until the filling of the imprint material 301 into the mold 102 is completed, or more specifically, until the mold 102 is released from the imprint material 103. In other words, during the imprint process, the holding of the substrate 103 is maintained in a region other than the region directly below the shot of the substrate chuck 108. This makes it possible to reduce the positional shift of the substrate 103 in the substrate chuck 108.

This embodiment exemplified a case in which the suction pressure of the substrate chuck 108 with respect to the substrate 103 is switched from the first suction pressure to the second suction pressure based on the profile of the pressing force (FIG. 7A) applied to the imprint material 301 on the substrate via the mold 102. However, the suction pressure of the substrate chuck 108 with respect to the substrate 103 may be switched from the first suction pressure to the second suction pressure based on the filling state of the imprint material 301 on the substrate into the mold 102 obtained by the observation unit 114. More specifically, when the filling state obtained by the observation unit 114 is a state in which the imprint material 301 on the substrate is filled over the entire surface of the mold 102, the suction pressure of the substrate chuck 108 with respect to the substrate 103 is switched from the first suction pressure to the second suction pressure.

Figure 8A:
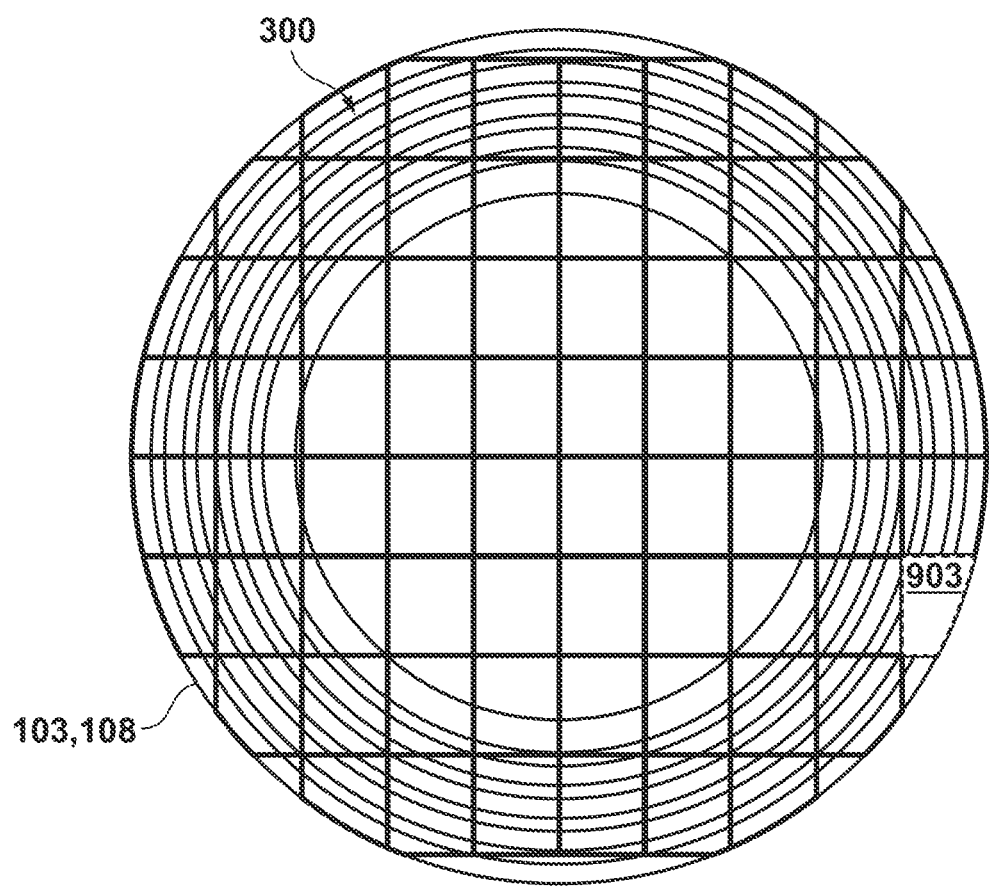
FIGS. 8A and 8B are views showing the positional relationship between the concave portion of the substrate chuck and the pattern portion of the mold.
Figure 8B:
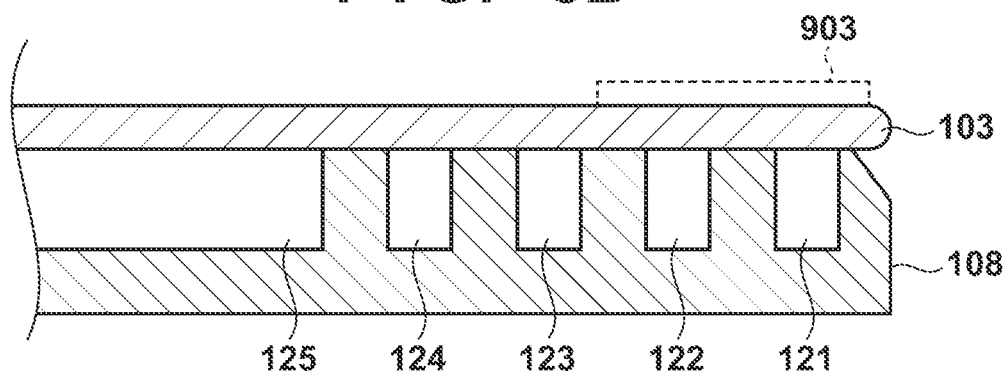

In addition, in the imprint apparatus 100, an imprint process is performed not only on the mold entire surface shot region but also on the partial shot region as shown in FIGS. 8A and 8B. Here, the partial shot region is a shot region in which a part of the pattern formed in the pattern portion 1021 of the mold 102 is transferred to the imprint material on the substrate and which includes the outer circumference (edge) of the substrate 103.

FIGS. 8A and 8B are views showing the positional relationship between the concave portions 121 to 125 of the substrate chuck 108 shown in FIG. 3 and the pattern portion 1021 of the mold 102 upon performing an imprint process on the partial shot region of the substrate 103 using the mold 102 shown in FIG. 4. Referring to FIGS. 8A and 8B, since the entire surface of the pattern portion 1021 of the mold 102 does not fit in a shot region 903 of the substrate 103, such a shot region is referred to as a partial shot region. In this case, each of the concave portions 121 and 122 is set as a region directly under the shot (first holding region), and each of the concave portions 123, 124, and 125 is set as a shot periphery region (second holding region). When an imprint process is performed on the partial shot region of the substrate 103, the suction pressure of the substrate chuck 108 with respect to the substrate 103 may be controlled as in the case of performing an imprint process on the mold entire surface shot region. In other words, there is no difference in control of the suction pressure of the substrate chuck 108 with respect to the substrate 103 between the partial shot region and the mold entire surface shot region.

The operation of the imprint apparatus 100 (an imprint process for each shot region of the substrate 103) will be described with reference to FIG. 9. In step S801, the substrate 103 is loaded on the substrate chuck 108. In step S802, a target shot region that is a target region for performing an imprint process is selected from a plurality of shot regions of the substrate 103.

In step S803, the profile of the pressing force (FIG. 7A) applied to the imprint material on the substrate via the mold 102 and corresponding to the target shot region selected in step S802 is obtained. The profile of the pressing force can be obtained by, for example, simulation using pieces of information such as the driving profile of the mold driving unit 131 with respect to the target shot region and the characteristics of the imprint material obtained from the recipe. In step S804, based on the profile of the pressing force obtained in step S803, the profile of the suction pressure (FIG. 7B) of the substrate chuck 108 with respect to the substrate 103 is generated.

In step S805, the imprint process is performed on the target shot region selected in step S802. In the imprint process, the suction pressure of the substrate chuck 108 with respect to the substrate 103 is controlled in accordance with the profile generated in step S804.

In step S806, it is determined whether there is a shot region that has not been selected as a target shot region. If there is a shot region that has not been selected as a target shot region, the process returns to step S802 in order to select a new target shot region. On the other hand, if there is no shot region that has not been selected as a target shot region, the process advances to step S807. In step S807, the substrate 103 is unloaded from the substrate chuck 108.

The pattern of a cured product formed using the imprint apparatus 100 is used permanently for at least some of various kinds of articles or temporarily when manufacturing various kinds of articles. The articles are an electric circuit element, an optical element, a MEMS, a recording element, a sensor, a mold, and the like. Examples of the electric circuit element are volatile and nonvolatile semiconductor memories such as a DRAM, a SRAM, a flash memory, and a MRAM and semiconductor elements such as an LSI, a CCD, an image sensor, and an FPGA. Examples of the mold are molds for imprint.

The pattern of the cured product is directly used as the constituent member of at least some of the above-described articles or used temporarily as a resist mask. After etching or ion implantation is performed in the substrate processing step, the resist mask is removed.

Figure 10A:
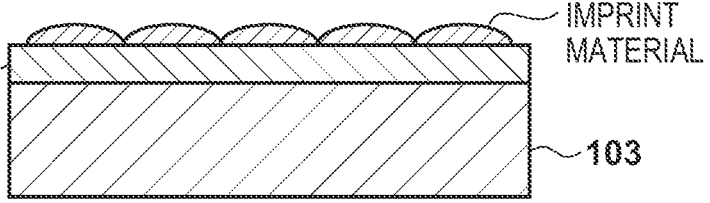
FIGS. 10A to 10F are views for explaining a method of manufacturing an article.

A detailed method of manufacturing an article will be described next. As shown in FIG. 10A, the substrate 103 such as a silicon wafer with a processed material such as an insulator formed on the surface is prepared. Next, an imprint material is applied to the surface of the processed material by an inkjet method or the like. A state in which the imprint material is applied as a plurality of droplets onto the substrate is shown here.

Figure 10B:
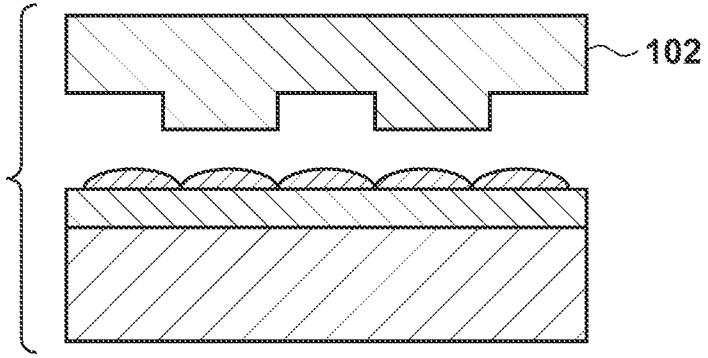
Figure 10C:
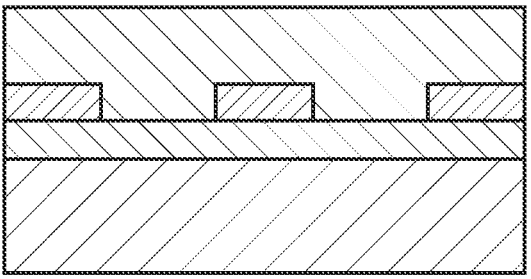

As shown in FIG. 10B, a side of the mold 102 for imprint with an uneven pattern is directed to and caused to face the imprint material on the substrate. As shown in FIG. 10C, the substrate 103 to which the imprint material is applied is brought into contact with the mold 102, and a pressure is applied. The gap between the mold 102 and the processed material is filled with the imprint material. In this state, when the imprint material is irradiated with energy for curing via the mold 102, the imprint material is cured.

Figure 10D:
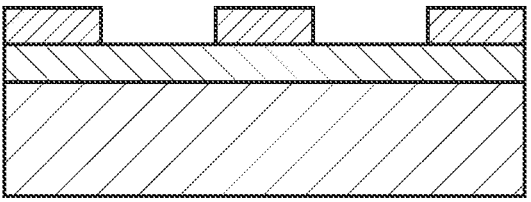

As shown in FIG. 10D, after the imprint material is cured, the mold 102 is released from the substrate 103. Then, the pattern of the cured product of the imprint material is formed on the substrate. In the pattern of the cured product, the concave pattern of the mold 102 corresponds to the convex portion of the cured product, and the convex pattern of the mold 102 corresponds to the concave portion of the cured product. That is, the uneven pattern of the mold 102 is transferred to the imprint material.

Figure 10E:
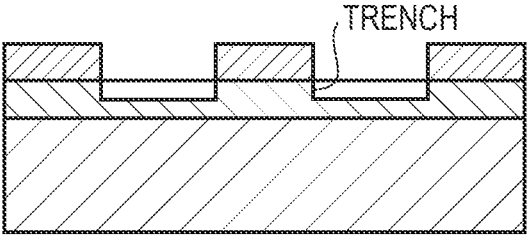
Figure 10F:
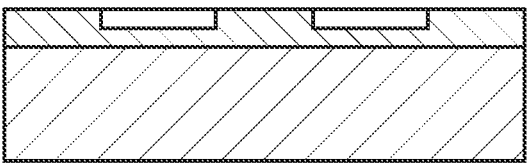

As shown in FIG. 10E, when etching is performed using the pattern of the cured product as an etching resistant mask, a portion of the surface of the processed material where the cured product does not exist or remains thin is removed to form a groove. As shown in FIG. 10F, when the pattern of the cured product is removed, an article with the grooves formed in the surface of the processed material can be obtained. Here, the pattern of the cured product is removed. However, instead of processing or removing the pattern of the cured product, it may be used as, for example, an interlayer dielectric film included in a semiconductor element or the like, that is, a constituent member of an article.

Note that this embodiment has exemplified, as the mold 102, a mold for transferring a circuit pattern with an uneven pattern. However, the mold 102 may be a flat template which includes a flat portion without an uneven pattern. A flat template (member) is used in a planarizing apparatus (molding apparatus) that performs a planarizing process (molding process) for molding a composition on a substrate to be flat using the flat portion. The planarizing process includes a process of curing a curable composition with light irradiation or heating in a state in which the flat portion of a flat template is in contact with a curable composition supplied on a substrate. In this manner, this embodiment is applicable to a molding apparatus that molds a composition on a substrate using a flat template.

The underlying pattern on a substrate has a concave/convex profile derived from a pattern formed in the previous step. More particularly, a substrate (process wafer) may have a step of about 100 nm along with a multilayer structure of a recent memory element. The step derived from the moderate undulation of the entire surface of a substrate can be corrected by the focus tracking function of an exposure apparatus (scanner) used in the photolithography process. However, the fine concave/convex portions having a small pitch and falling within the exposure slit area of the exposure apparatus directly consume the DOF (Depth Of Focus) of the exposure apparatus. As a conventional method of planarizing the underlying pattern of the substrate, a technique of forming a planarized layer, such as SOC (Spin On Carbon) or CMP (Chemical Mechanical Polishing) is used. However, in the conventional technique, as shown in FIG. 11A, only the unevenness suppression rate of 40% to 70% can be obtained in the boundary portion between an isolated pattern region A and a repetitive Dense (dense of line and space patterns) pattern region B so sufficient planarization performance cannot be obtained. In addition, the concave/convex difference of the underlying pattern by multilayer formation tends to increase.

As a solution to this problem, U.S. Pat. No. 9,415,418 proposes a technique of forming a continuous film by applying a resist serving as a planarized layer by an inkjet dispenser and imprinting with a flat template. In addition, U.S. Pat. No. 8,394,282 proposes a technique of reflecting the topography measurement result on the substrate side on density information for each position for which application of a resist is instructed by an inkjet dispenser. The imprint apparatus 100 is particularly applicable as a planarization (planarizing) apparatus for locally planarizing the surface of a substrate by pressing a flat template instead of the mold 102 against a pre-applied uncured resist (uncured material).

FIG. 11A shows the substrate before planarization is performed. The area of the convex pattern portion is small in the isolated pattern region A. In the repetitive Dense pattern region B, the area occupied by the convex pattern portion and the area occupied by the concave pattern portion are 1:1. The average heights of the isolated pattern region A and the repetitive Dense pattern region B have different values depending on the ratio occupied by the convex pattern portions.

FIG. 11B shows a state in which a resist for forming a planarized layer is applied to the substrate. FIG. 11B shows a state in which a resist is applied by an inkjet dispenser based on the technique proposed in U.S. Pat. No. 9,415,418. However, a spin coater may be used for applying the resist. In other words, the imprint apparatus 100 can be applied as long as it includes a step of planarizing a pre-applied uncured resist by pressing a flat template against it.

As shown in FIG. 11C, the flat template is made of glass or quartz that transmits ultraviolet light, and the resist is cured by irradiation with ultraviolet light from a light source. The flat template conforms to the profile of the substrate surface for gentle unevenness of the entire substrate. After the resist is cured, as shown in FIG. 11D, the flat template is released from the resist.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-076246 filed on Apr. 11, 2018, which is hereby incorporated by reference herein in its entirety.

What is claimed is:

1. A molding apparatus that performs a molding process for molding a composition on a target region of a substrate using a mold, comprising:
   a holding unit including a plurality of concave portions and configured to hold the substrate by making a pressure of the plurality of concave portions to negative pressure; and
   a control unit configured to control the molding process, wherein the control unit starts a process for pressing the mold against the composition on the target region of the substrate while the substrate is held by the holding unit with a first holding force, causes the holding unit to hold the substrate with a second holding force smaller than the first holding force by increasing a pressure of a first concave portion below the target region among the plurality of concave portions to make the pressure of the first concave portion to negative pressure or zero, after the process for pressing the mold is started, and maintains the holding of the substrate by the holding unit with the second holding force until completion of filling of the composition on the substrate into the mold.

2. The apparatus according to claim 1, wherein the control unit switches the holding force for holding the substrate by the holding unit from the first holding force to the second holding force after the process for pressing the mold is started and during a period in which a pressing force is applied to the composition on the substrate via the mold.

3. The apparatus according to claim 1, wherein the control unit causes the holding unit to hold the substrate with a third holding force larger than the second holding force after completion of filling of the composition on the substrate into the mold and before releasing the mold from the composition on the substrate.

4. The apparatus according to claim 1, wherein the control unit causes the holding unit to hold the substrate with a third holding force larger than the second holding force after completion of filling of the composition on the substrate into the mold and before curing the composition on the substrate while pressing the mold against the composition on the substrate.

5. The apparatus according to claim 3, wherein the third holding force is smaller than the first holding force.

6. The apparatus according to claim 3, wherein the third holding force is equal to the first holding force.

7. The apparatus according to claim 1, wherein the process for pressing the mold includes a first period in which a pressing force applied to the composition on the substrate via the mold is increased and a second period in which the pressing force is decreased, and
the control unit switches the holding force for holding the substrate by the holding unit from the first holding force to the second holding force at a timing at which the process for pressing the mold transitions from the first period to the second period.

8. The apparatus according to claim 7, wherein the control unit switches the holding force for holding the substrate by the holding unit from the second holding force to a third holding force larger than the second holding force at a timing at which the second period ends.

9. The apparatus according to claim 1, further comprising an obtaining unit configured to obtain a filling state of the composition on the substrate into the mold,
wherein the control unit switches the holding force for holding the substrate by the holding unit from the first holding force to the second holding force based on the filling state obtained by the obtaining unit.

10. The apparatus according to claim 9, wherein the control unit switches the holding force for holding the substrate by the holding unit from the first holding force to the second holding force when the filling state obtained by the obtaining unit is a state in which the composition on the substrate spreads over an entire surface of the mold.

11. The apparatus according to claim 1, wherein
the holding unit includes a plurality of holding regions capable of independently controlling holding forces with respect to the substrate, and
out of the plurality of holding regions, in a first holding region for holding a region corresponding to the target region, the control unit causes the substrate to be held with the second holding force after the process for pressing the mold is started, and maintains a state in which the substrate is held with the second holding force until completion of filling of the composition on the substrate into the mold, and
in a second holding region other than the first holding region out of the plurality of holding regions, the control unit maintains a state in which the substrate is held with the first holding force during a period from a start of the process for pressing the mold to completion of filling of the composition on the substrate into the mold.

12. The apparatus according to claim 1, wherein the molding apparatus forms a pattern of the composition on the substrate by bringing a pattern of the mold into contact with the composition.

13. The apparatus according to claim 1, wherein the molding apparatus planarizes the composition on the substrate by bringing a flat portion of the mold into contact with the composition.

14. The apparatus according to claim 1, wherein a plurality of first concave portions are below the target region, and
the control unit causes the holding unit to hold the substrate with the second holding force smaller than the first holding force by increasing a pressure of the plurality of first concave portions to make the pressure of the plurality of first concave portions to negative pressure or zero.

15. The apparatus according to claim 1, wherein the plurality of concave portions have a circular shape or a ring shape.

16. The apparatus according to claim 1, wherein the control unit causes the holding unit to hold the substrate with the second holding force smaller than the first holding force by making a pressure of a first concave portion, below the target region, of the plurality of concave portions larger than a pressure of a second concave portion, not below the target region, of the plurality of concave portions.

17. The apparatus according to claim 1, wherein the control unit starts the process for pressing the mold against the composition on the target region of the substrate while the substrate is held by the holding unit with the first holding force, causes the holding unit to hold the substrate with the second holding force smaller than the first holding force by increasing the pressure of the first concave portion below the target region among the plurality of concave portions to make the pressure of the first concave portion to the negative pressure, after the process for pressing the mold is started, and maintains the holding of the substrate by the holding unit with the second holding force until completion of filling of the composition on the substrate into the mold.

18. A method of manufacturing an article, comprising: forming a pattern on a substrate using a molding apparatus; processing the substrate on which the pattern is formed in the forming; and manufacturing the article from the processed substrate, wherein the molding apparatus performs a molding process for molding a composition on a target region of the substrate using a mold, and includes: a holding unit including a plurality of concave portions and configured to hold the substrate by making a pressure of the plurality of concave portions to negative pressure, and a control unit configured to control the molding process, and the control unit starts a process for pressing the mold against the composition on the target region of the substrate while the substrate is held by the holding unit with a first holding force, causes the holding unit to hold the substrate with a second holding force smaller than the first holding force by increasing a pressure of a first concave portion below the target region among the plurality of concave portions to make the pressure of the first concave portion to negative pressure or zero, after the process for pressing the mold is started, and maintains the holding of the substrate by the holding unit with the second holding force until completion of filling of the composition on the substrate into the mold.

* * * * *